(12) United States Patent
Herrin et al.

(10) Patent No.: US 8,796,058 B2
(45) Date of Patent: Aug. 5, 2014

(54) SEMICONDUCTOR STRUCTURE

(75) Inventors: Russell T. Herrin, Essex Junction, VT (US); Daniel R. Miga, St. Albans, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 13/287,575

(22) Filed: Nov. 2, 2011

(65) Prior Publication Data

US 2013/0105920 A1    May 2, 2013

(51) Int. Cl.
*H01L 29/84*    (2006.01)
*H01L 21/02*    (2006.01)

(52) U.S. Cl.
USPC ............... 438/50; 438/51; 438/52; 438/53

(58) Field of Classification Search
USPC ...................................... 438/50–53
See application file for complete search history.

(56) References Cited

U.S. PATENT DOCUMENTS

| 7,365,405 | B2 * | 4/2008 | Potochnik et al. ............ 257/419 |
| 2007/0155051 | A1 | 7/2007 | Wang et al. |
| 2011/0036174 | A1 | 2/2011 | Hooper et al. |

* cited by examiner

*Primary Examiner* — Robert Carpenter
(74) *Attorney, Agent, or Firm* — Anthony Canale; Roberts Mlotkowski Safran & Cole, P.C.

(57) ABSTRACT

Micro-Electro-Mechanical System (MEMS) structures, metrology structures and methods of manufacture are disclosed. The method includes forming one or metrology structure, during formation of a device in a chip area. The method further includes venting the one or more metrology structure after formation of the device.

17 Claims, 5 Drawing Sheets

SEMICONDUCTOR STRUCTURE

FIELD OF THE INVENTION

The invention relates to semiconductor structures and methods of manufacture and, more particularly, to Micro-Electro-Mechanical System (MEMS) structures, metrology structures and methods of manufacture.

BACKGROUND

Integrated circuit switches used in integrated circuits can be formed from solid state structures (e.g., transistors) or passive wires (MEMS). MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

Depending on the particular application and engineering criteria, MEMS structures can come in many different forms. For example, MEMS can be realized in the form of a cantilever structure. In the cantilever structure, a cantilever an (suspended electrode) is pulled toward a fixed electrode by application of a voltage. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness.

MEMS can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask.

To fabricate MEMS structures as well as other active or passive devices on a chip, metrology structures are typically implemented in the kerf area. The metrology structures assist in the fabrication of the devices on the chip, by providing alignment marks, as well as used as a means to measure focal planes for performing more accurate lithographic and etching processes, e.g., etching of wiring layers that were deposited at different levels of an insulator layer. The metrology structures are in some cases fabricated from a polymer material which remains encapsulated within insulator material (e.g., oxide) within the kerf structure after formation of the MEMS or other device. However, due to subsequent high temperature processing, the metrology structures are prone to deformation or explosion, resulting in damage to the chip structures and hence reduced yield.

Accordingly, there exists a need in the art to overcome the deficiencies and limitations described hereinabove.

SUMMARY

In a first aspect of the invention, a method comprises forming one or metrology structure, during formation of a device in a chip area. The method further comprises venting the one or more metrology structure after formation of the device.

In another aspect of the invention, a method comprises forming a first layer of sacrificial material in a chip area and forming a metrology structure in a kerf area, which is of same material as the sacrificial material. The method further comprises forming a second layer of the sacrificial material over the first layer of sacrificial material and in contact with at least one exposed portion of the first layer of sacrificial material. The method further comprises forming an insulator material over the metrology structure and the second layer of sacrificial material. The method further comprises forming vent holes exposing the second layer of the sacrificial material and the metrology structure. The method further comprises venting the first layer of sacrificial material, the second layer of sacrificial material and the metrology structure, through the vent holes. The method further comprises sealing the vent holes over the vented second layer of sacrificial material.

In yet another aspect of the invention, a structure comprises a MEMS structure in a chip area of a wafer. The MEMS structure comprises: an upper cavity; a lower cavity; a beam structure positioned between the upper cavity and the lower cavity; and at least one actuating electrode opposing the beam structure. At least one cavity is formed in a kerf area of the wafer. The at least one cavity is at the processing level of the lower cavity and the upper cavity.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the Micro-Electro-Mechanical System (MEMS) and metrology structures, which comprises the structures of the present invention. In still further embodiments, a method in a computer-aided design system is provided for generating a functional design model of the MEMS and metrology structures. The method comprises generating a functional representation of the structural elements of the MEMS and metrology structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to Micro-Electro-Mechanical System (MEMS) structures, formation and removal of sacrificial material from metrology structures and methods of manufacture. More specifically, the present invention provides a method of removing metrology structures in a kerf area, prior to high temperature processes. Advantageously, the method eliminates the possibility of the metrology structures exploding or deforming during high temperature processes and destroying the chip or contributing to low yields.

In embodiments, the metrology structures are formed in a kerf area, simultaneously with sacrificial material used to fabricate one or more cavities of a MEMS structure in a chip area. In embodiments, the metrology structures are formed of the same material as the sacrificial material, and are deposited and patterned during same processing steps with the sacrificial material. The metrology structures are also removed at the same time as the formation of the cavities for the MEMS structure, by fabricating vent holes to both the sacrificial material and the metrology structures, and venting the material (i.e., sacrificial material and metrology structures) in a same venting process. By venting the metrology structures, it is now possible to increase chip yield by avoiding explosion or deformation issues associated with the metrology structures.

Figure 1:
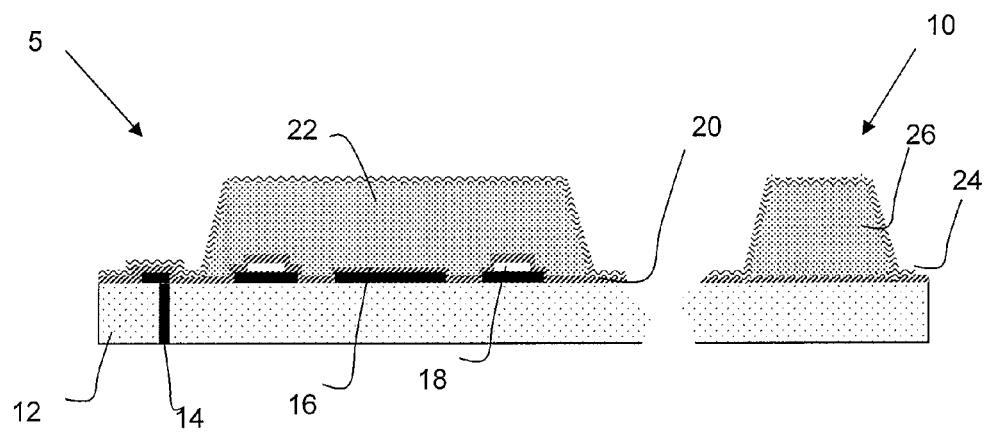
FIGS. 1-8 show structures and respective processing steps in accordance with aspects of the present invention.

FIG. 1 shows a structure and related processing steps in accordance with aspects of the invention. The structure includes, for example, a chip or die area 5 and a kerf area 10, both provided on a wafer. As should be understood by those of skill in the art, the chip or die area 5 will include active or passive structures, e.g., MEMS; whereas, the kerf area is an area between adjacent chips areas which is removed or destroyed during a dicing process. The chip or die area 5 and a kerf area 10 include a substrate 12 which, in embodiments, can be any layer of a device such as an oxide or other insulator material known to those of skill in the art.

In the chip or die area 5, an interconnect 14 is provided within the substrate 12, which can be, for example, a tungsten or copper silicide stud formed in a conventionally formed via. The interconnect 14 can be formed using any conventional lithographic, etching and deposition process, known to those of skill in the art for forming studs. Multiple wires 16 are formed on the substrate 12, using conventional deposition and patterning processes. For example, a wiring layer can be deposited on the substrate to a depth of about 0.25 microns; although other dimensions are also contemplated by the present invention. Thereafter, the wiring layer is patterned to form the wires 16. At least one of the wires 16 is in contact (direct electrical contact) with the interconnect 14, and at least one wire 16 is an actuator and/or fixed electrode of a MEMS structure as should be understood by those of skill in the art. In embodiments, the wires 16 can be formed from aluminum; although other wiring materials are also contemplated by the present invention, e.g., a refractory metal such as Ti, TiN, TiN and T, or AlCu, amongst other wiring materials.

As further shown in FIG. 1, an insulator material is deposited and patterned on one or more multiple wires 16 to form insulator pegs 18, for example. The insulator pegs 18 can be an oxide formed to a thickness of about 0.5 µm; although other thicknesses are also contemplated by the present invention. In embodiments, the insulator pegs 18 can be formed by a conventional oxide deposition process, known to those of skill in the art, e.g., chemical vapor deposition (CVD), and patterned using conventional lithography and etching processes, e.g., reactive ion etching (RIE).

An insulator material 20 is blanket deposited on the exposed portions of the multiple wires 16, insulator pegs 18 and portions of the substrate 12. In embodiments, the insulator material 20 is deposited to about 200 nm; although other dimensions are also contemplated by the present invention. In embodiments, the insulator material 20 can be an oxide or oxide based material, for example; although other insulator materials are also contemplated by the present invention. The insulator material 20 is deposited using, for example, a blanket deposition process over both the chip or die area 5 and kerf area 10.

In the chip or die area 5, a layer of sacrificial material 22 such as, for example, a sacrificial polydimethylglutarimide (PMGI) is deposited on the insulator material 20. The sacrificial PMGI layer 22 can be deposited using a conventional spin-on process. In embodiments, the sacrificial PMGI layer 22 is deposited to a height of about 1.5 microns (1.5 µm) to about 2 microns (2 µm), and is patterned using conventional lithographic and RIE processes. The sacrificial PMGI layer 22 can also undergo a reflow bake at about 250° C. to 300° C., prior to or after the patterning process. The sacrificial PMGI layer 22 can be used to form a lower cavity of a MEMS structure.

In embodiments, one or more PMGI structures 26 can also be patterned in the Kerf area 10, over the insulator material 24. The PMGI structure 26 and the sacrificial PMGI layer 22 are formed in the same process flows, e.g., deposition, patterning and reflow processes, and are formed at a same or substantially same level. In embodiments, the PMGI structure 26 can be used as a metrology measurement structure, alignment mark or an overlay mark, for example.

In both the chip or die area 5 and kerf area 10, an insulator material 24 is deposited using conventional deposition processes. For example, an insulator material 24 is deposited on the sacrificial PMGI layer 22, the insulator material 20 and the PMGI structure 26 using a low temperature deposition process. In embodiments, the insulator material 24 is an oxide or an oxide based material deposited to a thickness of about 150 nm using a low temperature CVD process, e.g., at about 190° C. It should be understood by those of skill in the art that other dimensions of insulator material 24 are also contemplated by the present invention.

Figure 2:
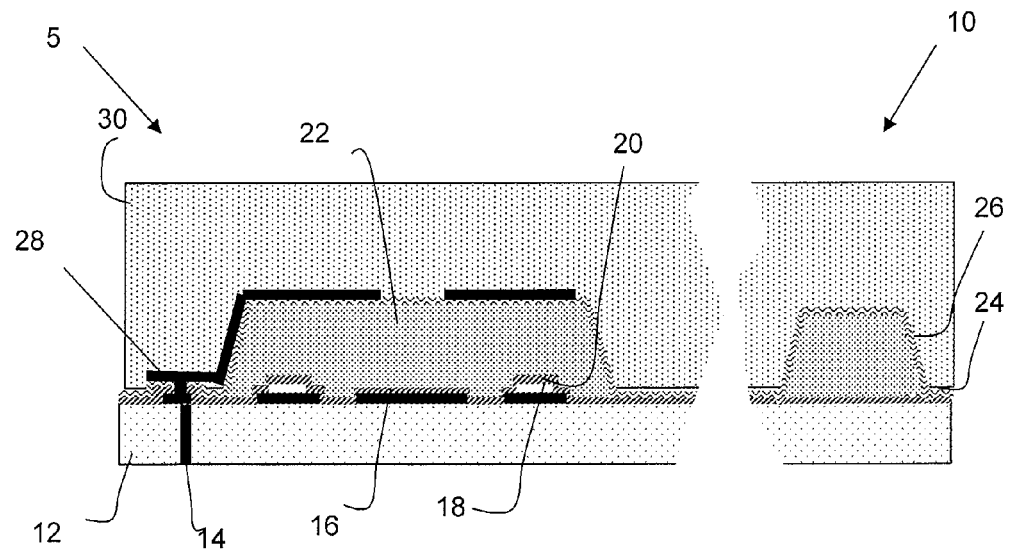

In FIG. 2, a metal layer 28 is deposited on the insulator material 24, in the die or chip area 5. The metal layer 28 will at least partially form a MEMS beam. In embodiments, the metal layer 28 can be deposited using any conventional deposition process, and patterned using any conventional patterning process, e.g., RIE. The metal layer 28 can be cleaned using any conventional cleaning processes. The metal layer 28 can be formed in contact with an underlying wire 16, by patterning the insulator layers 20 and 24, prior to the deposition step. An insulator material 30 is blanket deposited over the structure, including exposed portions of the metal layer 28, the insulator material 24, and the PMGI structure 26. In embodiments, the insulator layer 30 is deposited using a conformal deposition process using a low temperature process, e.g., about 190° C., to a thickness of about 2 µm; although other dimensions are contemplated by the present invention.

Figure 3:
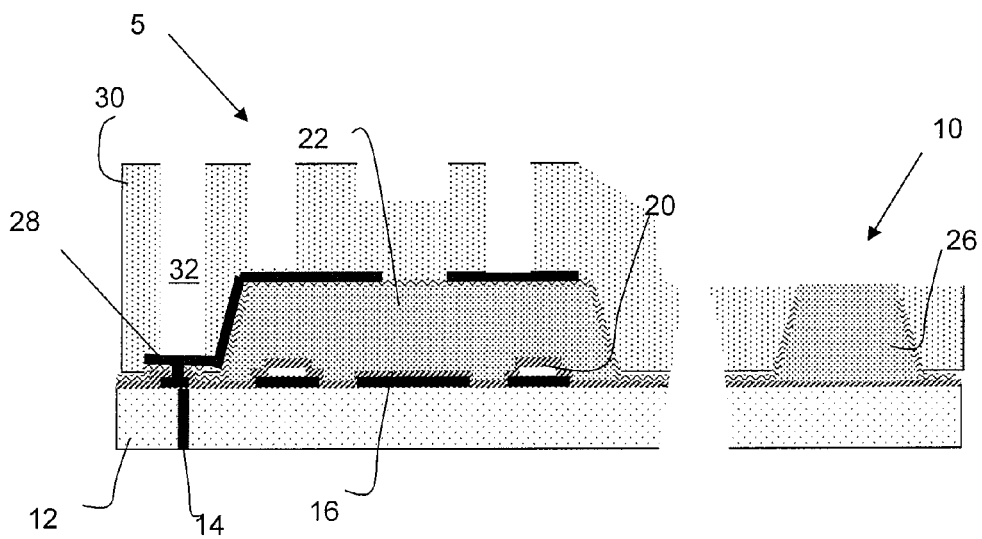

As shown in FIG. 3, vias 32 are formed in the insulator material 30. The vias 32 are formed using conventional photolithography and etching processes, e.g., RIE. In embodiments, the vias 32 expose portions of the wiring layers 28, formed over the sacrificial PMGI layer 22 and the wiring layer 16. The RIE processes can also be used to remove the insulator material 30 and a portion of the insulator material 24 over the PMGI structure 26, or to form a via exposing the PMGI structure 26 (similar to the via 32).

Figure 4:
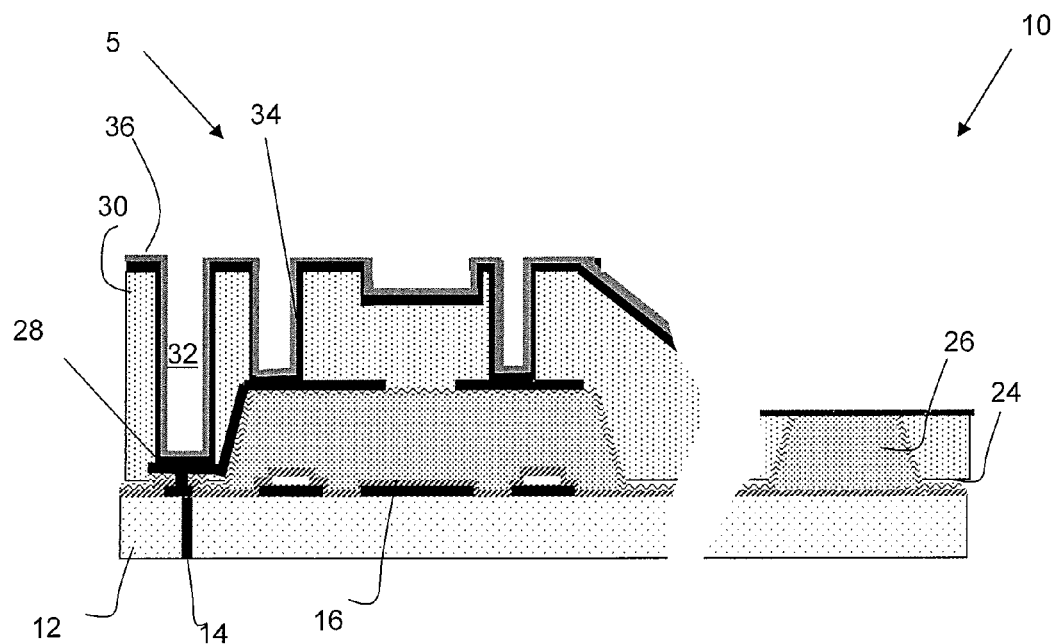

As shown in FIG. 4, in the chip or die area 5, the exposed portions of the vias 32 and the insulator layer 30 are lined with a metal layer 34. The metal layer 34 can be deposited using conventional metal deposition methods, and patterned using conventional lithography and etching processes, e.g., RIE. The metal layer 34 can be any metal such as, for example, aluminum. The metal layer 34 can form an upper portion of the MEMS beam. An insulator layer 36 is deposited on the metal layer 34 using, for example, a low temperature blanket CVD deposition, e.g., at about 190° C. The insulator layer 36 can be an oxide based material, deposited to a depth of about 150 nm; although other dimensions are also contemplated by the present invention. In embodiments, the insulator layer 36 can also be deposited on the PMGI structure 26.

Figure 5:
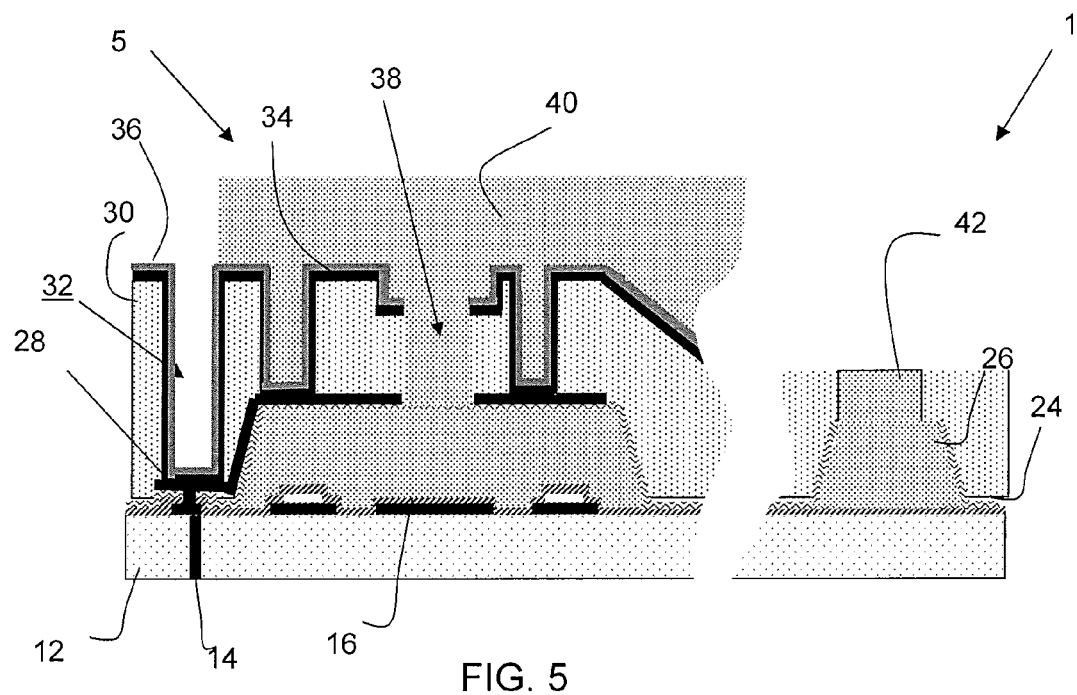

As shown in FIG. 5, a via 38 is formed in the insulator material 30, exposing the underlying sacrificial PMGI layer 22. The via 38 is formed through portions of the layers 34 and 36. The via 38 can be formed using any conventional lithography and etching process, e.g., RIE. In embodiments, the RIE processes can also be used to remove the insulator material 30 over the PMGI structure 26, if not previously removed (or a via to expose the PMGI structure 26). In addition, the RIE processes can also be used to remove the insulator layer 36, over the PMGI structure 26.

After the etching process, a sacrificial PMGI layer 40 is formed in the via 38 and over the insulator layer 36 to form an upper cavity of a MEMS structure. The sacrificial PMGI layer 40 can be formed in the manner described above. For example, the sacrificial PMGI layer 40 can be deposited, patterned and undergo a reflow bake at about 250° C. to 300° C., prior to or after the patterning process. A PMGI structure 42 can also be deposited in the Kerf area 10, over the insulator material 30 and PMGI structure 26. In embodiments, the PMGI structure 42 and the sacrificial PMGI layer 40 can be formed in the same processes, e.g., deposition, patterning and reflow processes. In embodiments, the PMGI structure 42 can be used as a metrology measurement structure, alignment mark or an overlay mark, for example. It should be understood that more than one PMGI structure 42 can be formed (i.e., deposited, patterned and reflowed) in the Kerf area 10, at this same level or a different level.

Figure 6:
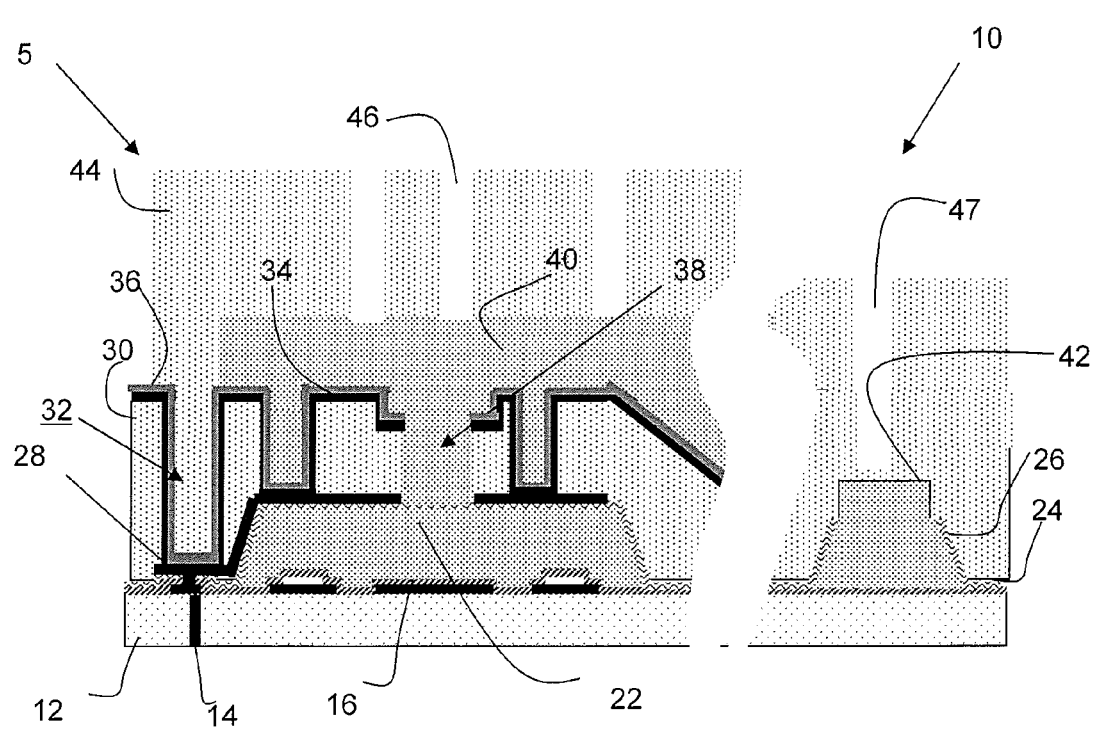

In FIG. 6, an insulator material 44 is blanket deposited over the structure, including the sacrificial PMGI layer 40 and PMGI structure 42. In embodiments, the insulator material 44 is deposited using a conformal deposition process using a low temperature process, e.g., about 190° C., to a thickness of about 2 µm; although other dimensions are contemplated by the present invention, e.g., upwards of about 4 µm. As further shown in FIG. 6, vent holes 46 are formed in the insulator material 40 to expose portions of the sacrificial PMGI layer 40 and PMGI structure 42. The vent holes 46 are formed using conventional photolithography and etching, e.g., RIB, processes, and can be formed at several locations, aligning with any structure in the kerf area 10.

Figure 7:
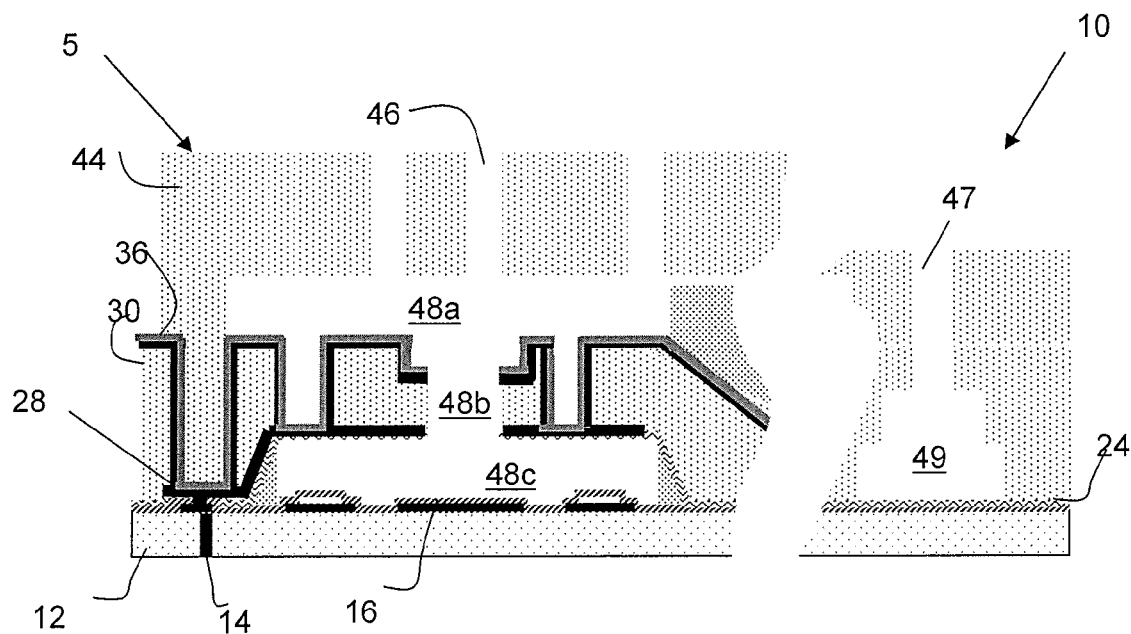

In FIG. 7, the sacrificial PMGI layer 40 and PMGI structures 26, 42 are vented (i.e., removed) through the vent holes 46. The venting can be performed by either a dry or wet etching process, selective to the PMGI (or other material to be removed). In this way, an upper cavity 48a, lower cavity 48b and connecting via 48c are formed, for a MEMS structure, in the chip or die area 5. Also, one or more cavity 49 is formed in the kerf area 10, depending on the location and number of structures, by venting through via 47; that is, one of skill the art would understood that any structure within the Kerf area, e.g., PMGI material or other metrology structures, can be vented in the manner described herein. For example, a vent hole can be used to expose a PMGI structure on any level of the structure and at location in the kerf area 10. In this way, the material, e.g., PMGI structures 26 and 42, in the Kerf area 10 will be removed, thus eliminating any possibility of deformation or explosion of such material during subsequent high temperature processing. Accordingly, yields can be significantly improved by the removal process of the metrology structures, e.g., PMGI structures 26 and 42 in the Kerf area 10.

Figure 8:
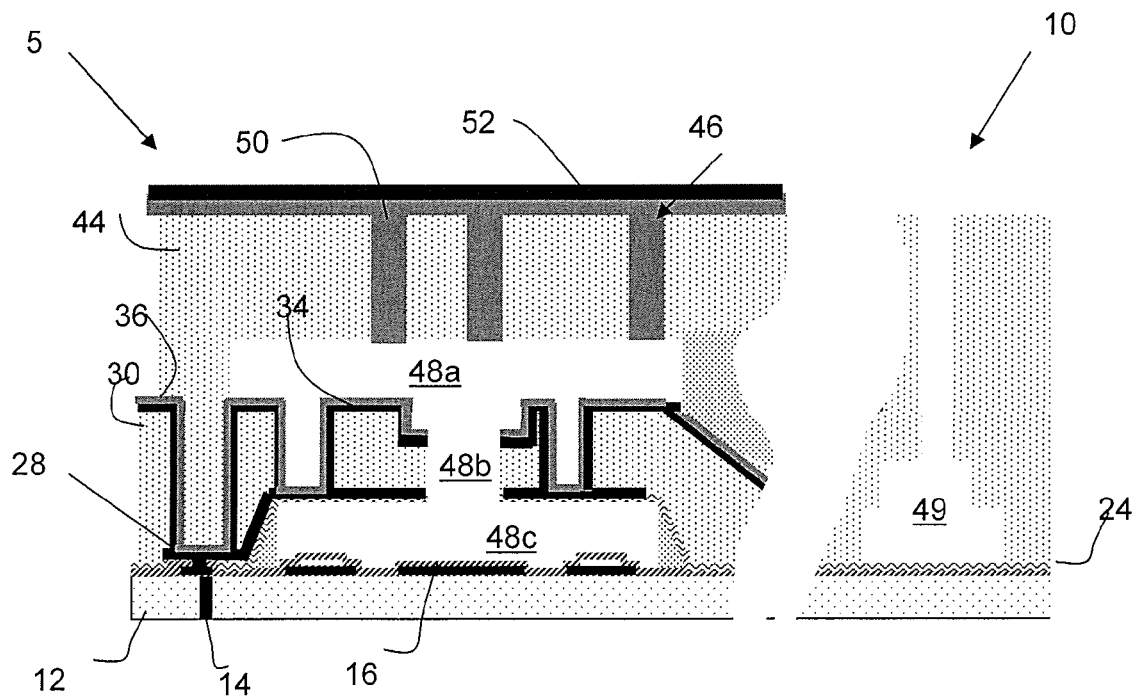

In FIG. 8, the vent holes 46 over the upper cavity 48a can be sealed with a dielectric material 50. For example, in embodiments, a PECVD process can form a dielectric material 50 of about 2 µm. In further embodiments, a nitride cap 52 is deposited on the dielectric material 50 to a thickness of about 0.5 µm. It should be understood by those of skill in the art that the vent holes over the cavity 49 can be sealed during later processing steps, or remain opened.

Figure 9:
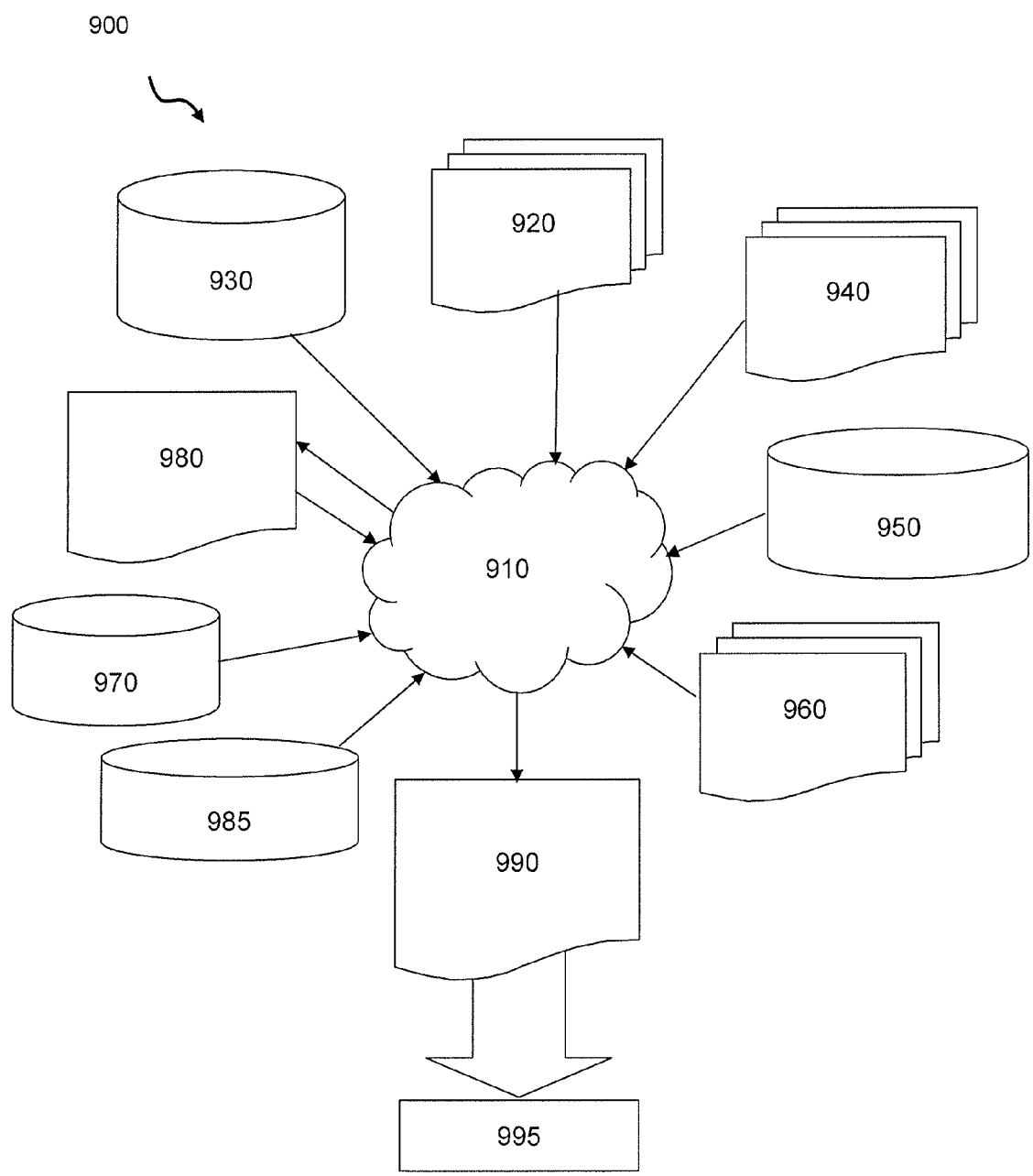
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method comprising:
   forming one or more metrology structure, during formation of a device in a chip area;

venting the one or more metrology structure after formation of the device;

forming at least one of an insulator and conductor material over the sacrificial material and the one or more metrology structure;

forming at least one vent hole in the at least one of insulator and conductor material to expose the sacrificial material and the one or more metrology structure; and sealing the at least one vent hole over the vented sacrificial material after the venting, wherein:

the one or more metrology structure and sacrificial material are vented through the at least one vent hole;

the device is a Micro-Electro-Mechanical System (MEMS) structure, and the one or more metrology structure is formed simultaneously with the sacrificial material used to form one or more cavities of the MEMS structure.

2. The method of claim 1, wherein the one or more metrology structure is a patterned layer of polymer material which is vented through at least one vent hole formed in at least one of one or more insulator and conductor layer.

3. The method of claim 1, wherein the one or more metrology structure is formed in a kerf area.

4. The method of claim 1, wherein the one or more metrology structure and the sacrificial material is polymer material, which is deposited and patterned simultaneously to form the one or more metrology structure and the sacrificial material.

5. The method of claim 1, wherein the one or more metrology structure is a plurality of metrology structures formed at different levels, and the venting removes the plurality of metrology structures during a cavity formation of the MEMS structure.

6. The method of claim 5, wherein the plurality of metrology structures are formed at substantially a same level as sacrificial material of the MEMS structure.

7. The method of claim 1, wherein the venting of the one or more metrology structure forms a cavity in a kerf area.

8. The method of claim 1, wherein the venting comprising removing of the one or more metrology structure through an etching step through the at least one vent hole in order to form a cavity structure.

9. The method of claim 8, wherein the removal of the one or more metrology structure comprises sacrificial material used to form a cavity of the device and the removing of the sacrificial material forms the cavity in a kerf area at a same time as forming a cavity of the device.

10. A method comprising:

forming a first layer of sacrificial material in a chip area;

forming a metrology structure in a kerf area, the metrology structure being formed of same material as the sacrificial material;

forming a second layer of the sacrificial material over the first layer of sacrificial material and in contact with at least one exposed portion of the first layer of sacrificial material;

forming at least one of an insulator and conductor material over the metrology structure and the second layer of sacrificial material;

forming vent holes exposing the second layer of the sacrificial material and the metrology structure;

venting the first layer of sacrificial material, the second layer of sacrificial material and the metrology structure, through the vent holes; and sealing the vent holes over the vented second layer of sacrificial material.

11. The method of claim 10, further comprising forming a beam structure between the first layer of sacrificial material and the second layer of sacrificial material.

12. The method of claim 10, wherein the first layer of sacrificial material, the second layer of sacrificial material and the metrology structure are polymer material.

13. The method of claim 10, wherein the first layer of sacrificial material is formed during same processing steps as the metrology structure and the second layer of sacrificial material is formed during same processing steps as a second metrology structure, at a level above the metrology structure.

14. The method of claim 13, wherein the metrology structure and the second metrology structure are both formed in the kerf area and are vented at a same time as the first layer of sacrificial material and second layer of sacrificial material, forming cavities of a MEMS structure.

15. The method of claim 10, wherein the venting of the metrology structure forms a cavity within insulator material in the kerf area.

16. The method of claim 10, further comprising forming a beam structure between the first layer of sacrificial material and the second layer of the sacrificial material, and wherein the venting the first layer of sacrificial material and the second layer of sacrificial material form cavities above and below the beam structure.

17. The method of claim 10, wherein the sealing the vent holes comprises forming an oxide material and nitride cap over the vent holes.

* * * * *